(12) United States Patent
Hassan et al.

(10) Patent No.: US 12,284,753 B2
(45) Date of Patent: Apr. 22, 2025

(54) ELECTROSTATIC DISCHARGE PROTECTION OF ELECTRONIC COMPONENT EMBEDDED IN LAMINATE OF PRINTED CIRCUIT BOARD

(71) Applicant: Infineon Technologies AG, Neubiberg (DE)

(72) Inventors: Mahadi-Ul Hassan, Regensburg (DE); Petteri Palm, Stein (DE); Thomas Gebhard, Villach (AT)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 17/989,228

(22) Filed: Nov. 17, 2022

(65) Prior Publication Data

US 2023/0164911 A1    May 25, 2023

(30) Foreign Application Priority Data

Nov. 25, 2021   (DE) ..................... 10 2021 130 924.7

(51) Int. Cl.
*H05K 1/02*  (2006.01)
*H05K 1/18*  (2006.01)
*H05K 3/46*  (2006.01)

(52) U.S. Cl.
CPC .......... *H05K 1/0259* (2013.01); *H05K 1/185* (2013.01); *H05K 3/4655* (2013.01); *H05K 2201/10166* (2013.01)

(58) Field of Classification Search
CPC ..... H05K 1/0259; H05K 1/185; H05K 3/4655
See application file for complete search history.

(56) References Cited

U.S. PATENT DOCUMENTS

| | | | |
|---|---|---|---|
| 9,698,139 B1 * | 7/2017 | Lu | ........................ H01L 27/0251 |
| 2004/0217425 A1 | 11/2004 | Brodsky et al. | |
| 2011/0176246 A1 * | 7/2011 | Kim | ........................ H01L 24/19 |
| | | | 156/196 |
| 2011/0211319 A1 | 9/2011 | Kosowsky et al. | |
| 2016/0029479 A1 | 1/2016 | Yoo et al. | |
| 2016/0343676 A1 | 11/2016 | Chen et al. | |
| 2017/0294775 A1 | 10/2017 | Chen | |
| 2021/0098987 A1 | 4/2021 | Walimbe et al. | |
| 2021/0193595 A1 | 6/2021 | Elsherbini et al. | |

FOREIGN PATENT DOCUMENTS

| | | |
|---|---|---|
| CN | 112086437 | 12/2020 |
| WO | 18190881 | 10/2018 |

* cited by examiner

*Primary Examiner* — Jeremy C Norris
(74) *Attorney, Agent, or Firm* — Dicke, Billig & Czaja, PLLC

(57) ABSTRACT

A printed circuit board and method of manufacturing a printed circuit board are disclosed. In one example, the method comprises embedding an electronic component in a laminate, and protecting the electronic component against electrostatic discharge during at least part of the manufacturing process by an electrically conductive electrostatic discharge protection structure integrated in the laminate and connected to the electronic component.

19 Claims, 9 Drawing Sheets

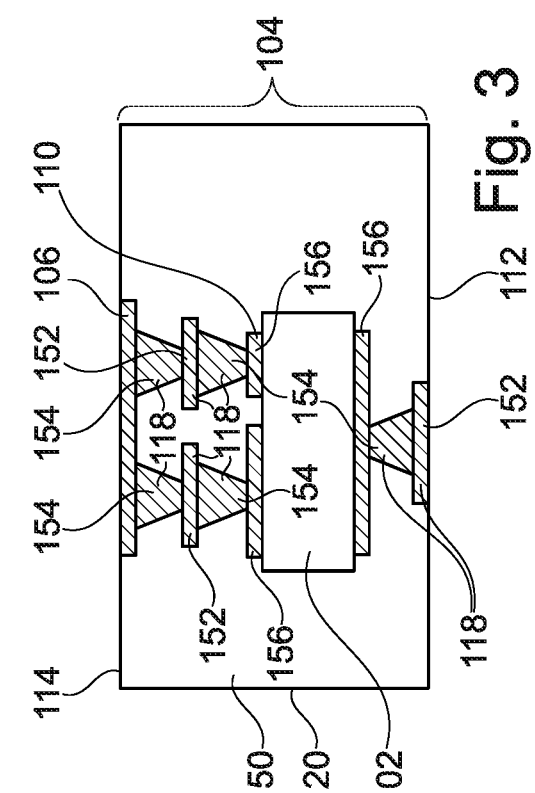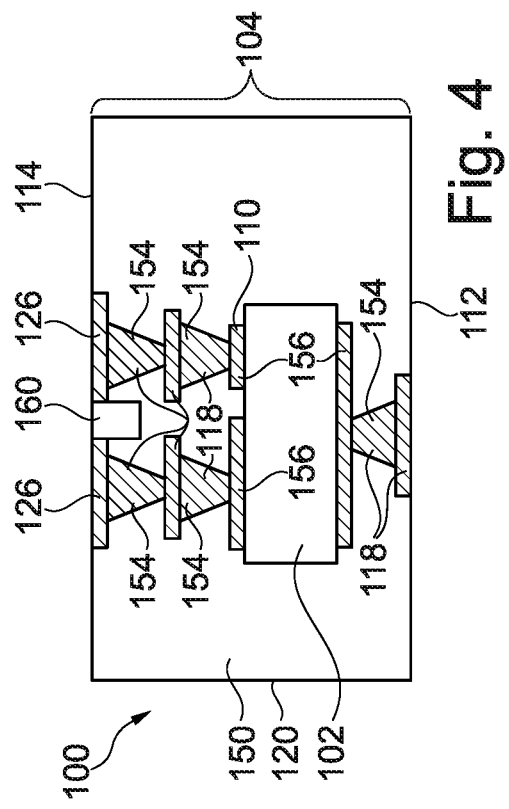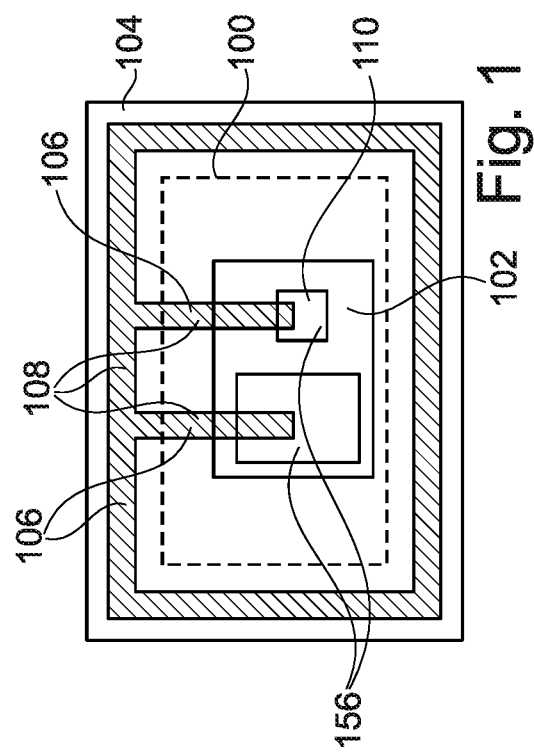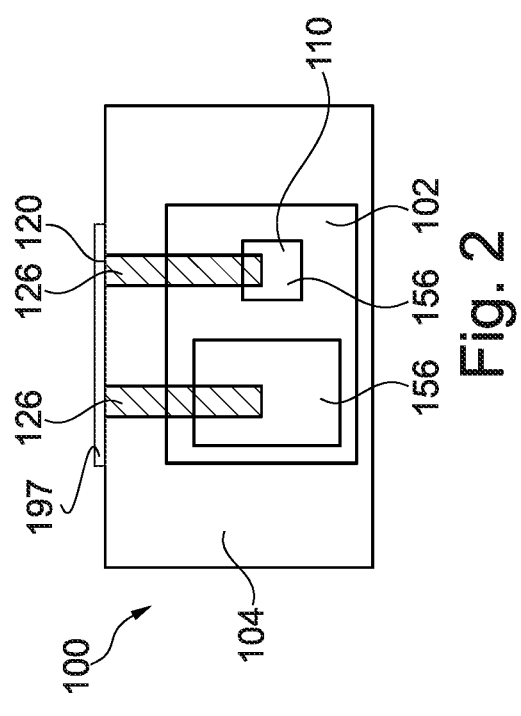

ELECTROSTATIC DISCHARGE PROTECTION OF ELECTRONIC COMPONENT EMBEDDED IN LAMINATE OF PRINTED CIRCUIT BOARD

CROSS-REFERENCE TO RELATED APPLICATION

This Utility Patent Application claims priority to German Patent Application No. 10 2021 130 924.7, filed Nov. 25, 2021, which is incorporated herein by reference.

BACKGROUND

Technical Field

Various embodiments relate generally to a method of manufacturing a printed circuit board, and a printed circuit board.

Description of the Related Art

Packages may be denoted as usually encapsulated electronic components with electrical connects extending out of the encapsulant. For example, packages may be connected to an electronic periphery or mounted onto a heatsink and connected via connectors to a larger system. An alternative to mold-type encapsulants are laminate-type encapsulants, as in printed circuit boards.

In particular laminated packages with embedded electronic component(s) may suffer from limit reliability. Packages, when embedded inside a printed circuit board (PCB) by lamination, might be vulnerable for electrostatic discharge (ESD) damage during the PCB embedding process.

There may be a need for a printed circuit board with embedded electronic component having a proper reliability.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 illustrates a preform of a printed circuit board and FIG. 2 illustrates a readily manufactured printed circuit board according to an exemplary embodiment.

FIG. 3 illustrates a preform of a printed circuit board and FIG. 4 illustrates a readily manufactured printed circuit board according to another exemplary embodiment.

DETAILED DESCRIPTION

Figure 5:
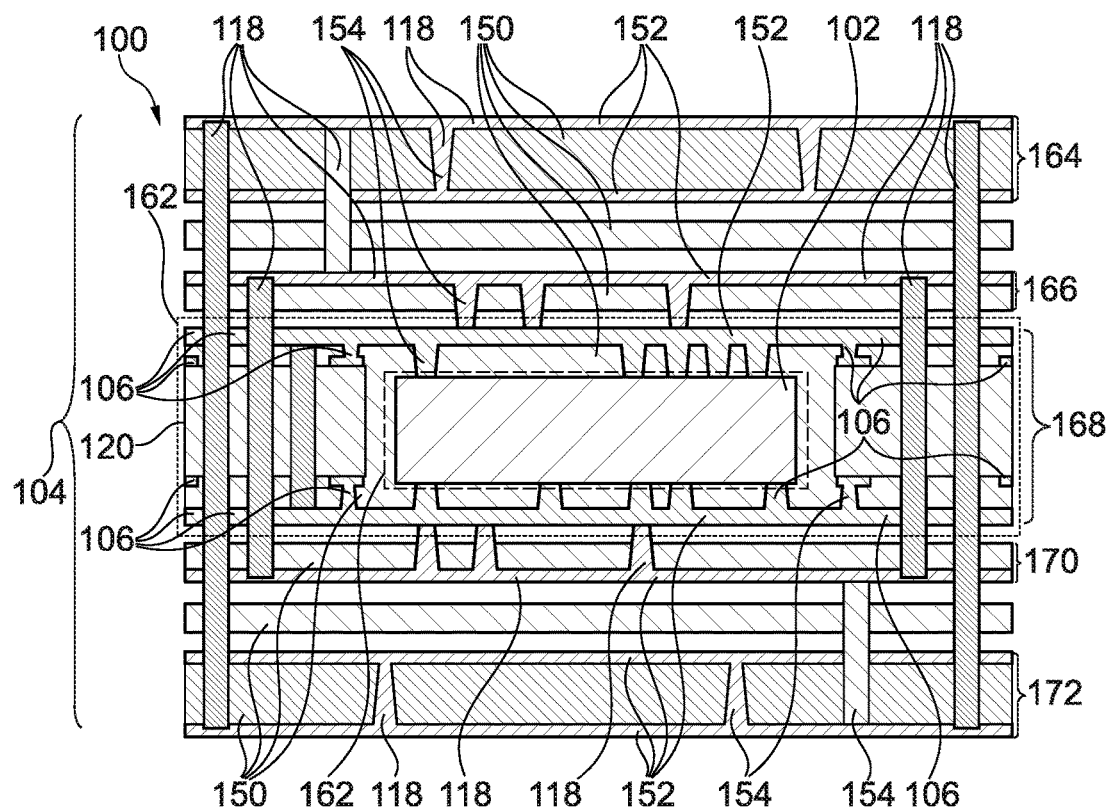
FIG. 5 illustrates an exploded view of a preform of a printed circuit board according to an exemplary embodiment before cutting.

According to an exemplary embodiment, a method of manufacturing a printed circuit board is provided, wherein the method comprises embedding an electronic component in a laminate, and protecting the electronic component against electrostatic discharge during at least part of the manufacturing process by an electrically conductive electrostatic discharge protection structure integrated in the laminate and connected to the electronic component.

According to another exemplary embodiment, a printed circuit board is provided which comprises a laminate, an electronic component embedded in the laminate, and electrically conductive electrostatic discharge protection structure residues remaining at the printed circuit board after removing part of an electrically conductive electrostatic discharge protection structure protecting the electronic component against electrostatic discharge during at least part of a process of manufacturing the printed circuit board.

According to an exemplary embodiment, a manufacturing architecture for printed circuit boards (PCBs) with embedded component(s) is provided in which preforms of printed circuit boards are reliably protected against electrostatic discharge (ESD) during their manufacturing process. More specifically, ESD sensitive components may be reliably embedded in a PCB without the risk of ESD-related damage. This can be accomplished by integrating an electrically conductive electrostatic discharge protection structure directly into the preform of the PCB(s) and by electrically coupling it to the embedded electronic component. Thanks to the electrostatic discharge protection structure, an electric coupling of the component (for instance at least part of pads thereof) may be created without ESD issues. Prior to completing manufacture of the PCB(s), the electrostatic discharge protection structure may, if desired or required, be removed partially or entirely, so that the electric connection of the embedded component may be transferred from an ESD-protected manufacturing configuration into a functional configuration for use of the readily manufactured PCB. When the electrostatic discharge protection structure is only removed partially before completing the PCB manufacture, electrostatic discharge protection structure residues may remain in the final PCB which are a fingerprint of the temporary ESD protection during manufacture.

Description of Further Exemplary Embodiments

In the following, further exemplary embodiments of the printed circuit board and the method will be explained.

In the context of the present application, the term "printed circuit board" (PCB) may particularly denote a carrier in form of a multi-layer laminate of dielectric layers (for instance made of prepreg or FR4) and metallic layers (for example copper layers), wherein vertical connections may be accomplished for example by metallic vias (such as copper laser vias).

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a pressure sensor, a light sensor or a gas sensor), an actuator (for instance a loudspeaker), and a microelectromechanical system (MEMS, for instance a loudspeaker, a member comprising a mechanical spring, etc.). However, in other embodiments, the electronic component may also be of different type, such as a mechatronic member, in particular a mechanical switch, etc.

In the context of the present application, the term "embedded electronic component" may in particular be an electronic component integrated partially or entirely in an interior of the laminate rather than being surface mounted thereon.

In the context of the present application, the term "laminate" may particularly denote an interconnected stack of dielectric and metallic layers. Said interconnection may be accomplished by lamination which denotes pressurizing the layer stack, preferably at an elevated temperature.

In the context of the present application, the term "electrostatic discharge protection structure" may particularly denote an electrically conductive structure configured specifically for inhibiting or even disabling electrostatic discharge phenomena acting on the embedded component. In this context, electrostatic discharge (ESD) may denote a sudden flow of electricity between two or more electrically charged objects caused by a contact, an electrical short or a dielectric breakdown. For example, a buildup of static electricity can be caused by parasitic charging or by electrostatic induction. For instance, an electrostatic discharge protection structure may electrically couple pads of an electronic component with each other, at least one of which being otherwise prone to ESD-based damage, to bring them to the same electric potential.

In the context of the present application, the term "electrostatic discharge protection structure residue" may particularly denote electric circuitry of a printed circuit board without function during ordinary use of the PCB, but being a part of a former electrostatic discharge protection structure temporarily protecting a preform of the PCB during manufacture against ESD. Before completing manufacture of a PCB, it may be advantageous to interrupt the electrostatic discharge protection structure, since ESD-protection desired during manufacture and provided by the electrostatic discharge protection structure may be no longer necessary, and the function of the readily manufactured PCB may require bringing previously shorted pads of the embedded component to different electric potentials.

In an embodiment, the method comprises fixing one or more electrostatic discharge-sensitive terminals of the electronic component by the electrically conductive electrostatic discharge protection structure to an electrostatic discharge protection potential during at least part of the manufacturing process of the PCB. Depending on the characteristics of an embedded electronic component, one or several terminals may be specifically prone to ESD damage during the manufacturing process. For instance, a gate pad of a field effect transistor-type electronic component may be specifically sensitive with respect to ESD phenomena. By the ESD protection structure, such at least one ESD-sensitive terminal of the embedded electronic component may be brought to an electrostatic discharge protection potential, which can be for instance a predefined electric reference potential (for instance a ground potential), or an electric potential of another terminal of the electronic component with which the ESD-sensitive terminal may be short-circuited by the ESD protection structure. For instance, a gate pad or terminal may be shorted with respect to a source pad or terminal for ESD protection.

In an embodiment, the method comprises configuring the electrostatic discharge protection structure as an electrostatic discharge protection interconnection network. Such an ESD protection interconnection network may be a bifurcated electrically conductive wiring in and/or on the laminate. For instance, the ESD protection interconnection network may extend over one or various vertically stacked layers of the laminate. In particular, the ESD protection interconnection network may be formed during formation of the laminate, and thus substantially without extra effort.

In an embodiment, the method comprises forming the electrostatic discharge protection interconnection network on one or both opposing main surfaces of the printed circuit board and/or extending through the laminate. By arranging substructures of the ESD protection interconnection network on both opposing main surfaces of the PCB and by interconnecting said substructures by an electrically conductive through connection extending vertically through the laminate, it may be in particular possible to bring terminals on both opposing main surfaces of the embedded electronic component(s) to the same electric potential during the manufacturing process for ESD protection purposes. Such an architecture is highly efficient in terms of ESD protection and contributes to a compact design.

In an embodiment, the method comprises removing at least part of the electrostatic discharge protection structure from the printed circuit board before completing manufacture of the printed circuit board. For example, this may be done for enabling the one or more electrostatic discharge-sensitive terminals of the electronic component to be at one or more different or varying electric potentials during use of the printed circuit board. Hence, the ESD protection structure may be functionally active only during the manufacturing process and may be at least partially interrupted or removed before the first use of the PCB.

In an embodiment, the removing is accomplished by separating the printed circuit board from other printed circuit boards of a common panel. In particular, the at least partial removal or functional deactivation of the ESD protection structure may be carried out simultaneously with a separation of a panel into individual printed circuit boards at the end of a manufacturing process. Hence, also the at least partial removal of the ESD protection structure before the first use of the PCB may be carried out substantially without extra effort. For a high throughput manufacturing process, a plurality of PCBs may be manufactured together on panel level before separating the panel into individual PCBs. Also the ESD protection structure may be formed on panel level, i.e. as a common structure for a plurality of PCBs of the panel.

In an embodiment, the method comprises integrating a functional electric connection network in the laminate for functionally coupling the electronic component, coupling the functional electric connection network with the electrostatic discharge protection interconnection network during at least part of the process of manufacturing the printed circuit board, and disconnecting at least part of the functional electric connection network from at least part of the electrostatic discharge protection interconnection network before completing the manufacturing process of the printed circuit board. Hence, the ESD protection structure may function temporarily for protecting an embedded component of the printed circuit board against ESD damage. This may make a high effort in terms of sophisticated ESD protection measures in a PCB manufacturing plant dispensable and may thereby simplify the manufacturing process significantly. After the manufacturing process, the ESD protection structure may be structurally deactivated in the PCB, for making the PCB fit for its function during normal use. During normal use, the functional structure without the ESD protection structure provides the actual function of the PCB with its embedded component(s).

In an embodiment, the method comprises disconnecting at least part of the functional electric connection network from at least part of the electrostatic discharge protection interconnection network during separating the printed circuit board from a panel comprising a plurality of printed circuit boards. Hence, deactivation of the ESD protection structure after completing manufacture of the PCB does not require any additional action apart from the singularization process which is anyhow necessary.

In an embodiment, the method comprises disconnecting at least part of the functional electric connection network from at least part of the electrostatic discharge protection interconnection network by separating along a circumferentially closed lateral edge of the printed circuit board. Hence, cutting out a readily manufactured PCB from a panel compound may also deactivate the ESD protection interconnection network. In particular, residues of the ESD protection interconnection network may remain at sidewalls of the separated PCBs.

In an embodiment, the method comprises disconnecting the functional electric connection network from the electrostatic discharge protection interconnection network by removing material from a central portion of a main surface of the printed circuit board apart from a lateral edge of the printed circuit board. In such an embodiment, the separation of the ESD protection interconnection network from the functional electric connection network may be accomplished by removing material of the ESD protection interconnection network at an interior of the laminate rather than at a sidewall thereof. For instance, a hole may be drilled in a central portion of the laminate by which an electrically conductive path provided by the ESD protection interconnection network may be interrupted.

In an embodiment, the method comprises forming the electrostatic discharge protection structure in the laminate immediately after (i.e. directly following) embedding the electronic component. Thus, when the sub-process of embedding the electronic component is completed, at least part of the ESD protection structure may be formed in a directly following manufacturing stage. This ensures short electrically conductive paths from the electronic component to the ESD protection structure and an ESD protection of the embedded component over the entire manufacturing process in which it is embedded.

In an embodiment, the method comprises embedding at least one further electronic component in the laminate, and fixing one or more further electrostatic discharge-sensitive terminals of the at least one further electronic component to the electrostatic discharge protection potential, to which the one or more electrostatic discharge-sensitive terminals of the electronic component is or are fixed, during at least part of the manufacturing process. Hence, the ESD protection structure may be configured for providing ESD protection to a plurality of electronic components embedded in the laminate. For instance, said electronic components may be arranged side-by-side at the same vertical level, and/or may be vertically stacked on top of each other (with or without laminate material in between). It is also possible that embedded and surface mounted components are ESD protected by an ESD protection structure during at least part of the manufacturing process of the PCB.

In an embodiment, the method comprises embedding a field effect transistor (FET) chip, as the electronic component, in the laminate, and fixing at least a gate terminal, as electrostatic discharge-sensitive terminal, to the electrostatic discharge protection potential during at least part of the manufacturing process. It has turned out that in particular a gate terminal of a FET is particularly prone to ESD issues. Thus, ensuring that the gate terminal is at a desired or fixed electric potential, for instance in relation to another terminal (in particular to a source terminal) of the FET, may be of utmost advantage.

In an embodiment, the electrostatic discharge protection structure residues are residues of the electrostatic discharge protection interconnection network of the electrically conductive discharge protection structure fixing one or more electrostatic discharge-sensitive terminals of the electronic component to an electrostatic discharge protection potential during at least part of the manufacturing process. The presence of such functionally inactive ESD protection structure residues in a readily manufactured PCB indicate the former presence of a corresponding ESD protection structure temporarily protecting one or more embedded components of the PCB during manufacturing.

In an embodiment, at least part of the electrically conductive electrostatic discharge protection structure residues is electrically coupled with the electronic component. Thus, the ESD protection structure residues may be functionally inactive electrically conductive paths being nevertheless connected with the electronic component(s) in the interior of the laminate.

In an embodiment, at least part of the electrically conductive electrostatic discharge protection structure residues extends up to a lateral edge or sidewall of the printed circuit board. More specifically, at least part of the electrically conductive electrostatic discharge protection structure residues may be exposed at an exterior lateral sidewall of the laminate, in particular at a vertical position above a lower main surface and below an upper main surface of the laminate.

Alternatively, a sidewall surface of the electrically conductive electrostatic discharge protection structure residues may be covered by a passivation or protection coating, in particular a dielectric passivation or protection coating. This may avoid direct exposure of metallic surfaces at a sidewall of the PCB, as the residues may be still connected to the electrically functioning interconnection.

Figure 16:
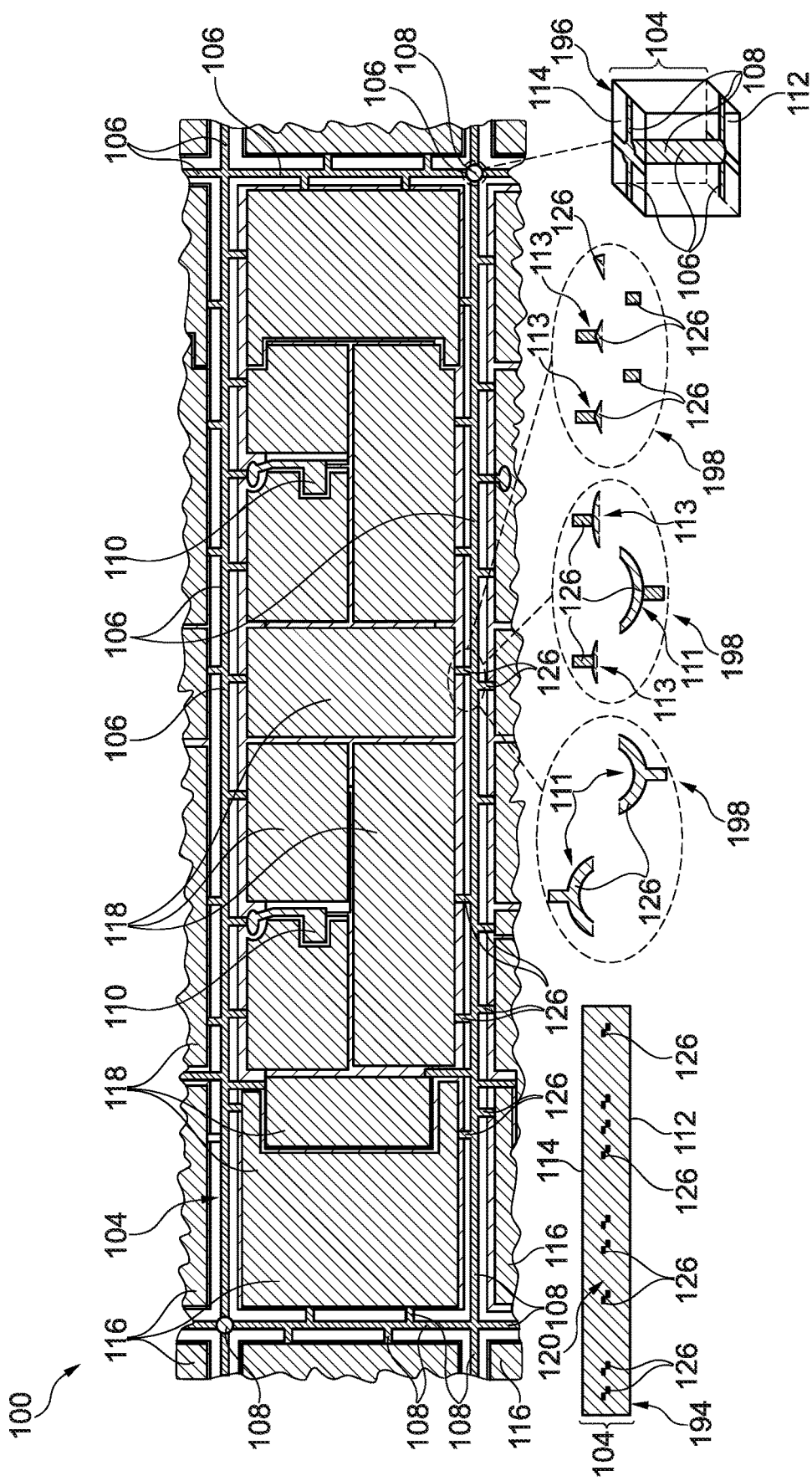
FIG. 16 illustrates a plan view of the printed circuit board according to FIG. 15 with further details.

In an embodiment, the electrostatic discharge protection structure residues comprise at least one of a group consisting of at least one substantially Y-shaped substructure, at least one substantially T-shaped substructure, and at least one vertically extending substructure connecting planar substructures in parallel planes. Such structures may ensure a proper coupling with the embedded component(s) during manufacture and a reliable disconnection after manufacture. Examples of such structures are shown in FIG. 16.

In an embodiment, the printed circuit board comprises a further laminate, a further electronic component embedded in the further laminate, and further electrically conductive electrostatic discharge protection structure residues remaining at the printed circuit board after removing part of a further electrically conductive electrostatic discharge protection structure protecting the further electronic component against electrostatic discharge during at least part of the manufacturing process. The laminate and the further laminate may be vertically stacked, and may be for instance interconnected by lamination. Thus, multiple layer stacks may be arranged on top of each other, each layer stack having embedded at least one electronic component. For each of the layer stacks, an ESD protection structure may be provided, so that all embedded components may be reliably protected against ESD issues during manufacture. In particular, two or more separate grids of electrically conductive structures may be implemented in a printed circuit board as separate or interconnected ESD protection structures. After separation of the PCBs from a panel, the grid-type ESD protection structures may be broken for making the PCB ready for use.

In an embodiment, the electronic component is a semiconductor chip, in particular a power semiconductor chip, more particularly a power field effect transistor chip. For example, the electronic component(s) may form at least one of the group consisting of a controller circuit, a driver circuit, and a power semiconductor circuit. All these circuits may be integrated into chips. For instance, a corresponding power semiconductor application may be realized by the chips, wherein integrated circuit elements of such a power semiconductor chip may comprise at least one transistor (in particular a MOSFET, metal oxide semiconductor field effect transistor, or an insulated gate bipolar transistor, IGBT), at least one diode, etc. In particular, circuits fulfilling a half-bridge function, a full-bridge function, etc., may be manufactured.

In an embodiment, the PCB is configured as a power converter, in particular one of an AC/DC power converter and a DC/DC power converter. However, also other electronic applications, such as inverters, etc. may be possible.

As substrate or wafer for semiconductor chip-type electronic components, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematic and not to scale.

Before exemplary embodiments will be described in more detail referring to the figures, some general considerations will be summarized based on which exemplary embodiments have been developed.

Integration of electric components into printed circuit boards (PCB) offers many advantages, for example an increase of power density, a rugged system design, a short interconnection between electronic components to reduce parasitic resistances and inductances, etc.

Embedding active devices inside of a PCB may require conventionally special protection measures against ESD during various process stages in particular during device placement inside a core cavity. Transportation of panels in carts and storage of panels may be carried out in ESD safe racks and shelves. Air ionizers, tool modification, employee training and special handling instructions may be conventionally necessary as well.

In particular, a high ESD-safety standard may be desired in a PCB embedding line. In view of this, high effort and complications to change a standard PCB line to a device embedding line may occur. However, inlay embedding is mainly aimed to use a standard PCB line. ESD damage can impact the target yield of production of PCBs with embedded electronic components.

Embedding of electronic parts into the PCB implies that electronic parts have to be handled during the PCB production. Due to the fact that none of standard PCB-production process stages are designed taking static electric discharge (ESD) hazard into account, it may become a significant risk for the functional health of these electronic devices during various process stages.

ESD-hazard requires special mitigation measures compared to a standard PCB manufacturing line. Thus, a PCB manufacturing line shall fulfill maximum ESD-safety standards to be qualified for PCB embedding of electronic components. This may be cumbersome.

According to an exemplary embodiment, an auxiliary ESD protection structure may be integrated into a preform of a PCB being presently manufactured, for protecting an embedded component thereof against ESD damage during the manufacturing process. Hence, the electrostatic discharge protection structure can be integrated into the preform of the PCB, for instance based on standard PCB processing methods, to enable PCB embedding of electronic components or parts in a standard PCB manufacturing line, to keep the need for additional ESD safety measures at a low level. Descriptively speaking, one or more ESD-sensitive terminals of the electronic components or devices may be temporarily pinned to a common electric potential by an electric interconnection network within the PCB. Preferably, the electric interconnection network may be realized in immediate subsequent order to the embedding process of the electronic component(s) into the PCB. After having completed the manufacture of the PCB, at least part of the ESD protection structure may be removed from the PCB. A part of the ESD protection structure may remain part of the readily manufactured PCB as (in particular functionally inactive) ESD protection structure residue. By integrating an ESD protection into a PCB structure on hardware level may relax the ESD requirements of a manufacturing line.

According to an exemplary embodiment, ESD protection of an inlay of a printed circuit board may be ensured during an embedding process by an ESD protection structure integrated in the PCB laminate for ESD protection during manufacture. After manufacture, the ESD protection structure may be at least partially removed.

According to exemplary embodiments, it may be advantageous to pin all electrical potentials of ESD sensitive terminals of the embedded electronic component to a common electric potential. In a preferred embodiment, pinning the electric potential of ESD-sensitive terminals of the electronic devices to a common electric potential may be accomplished by an electric interconnection network within the PCB. Breaking of unwanted ESD protection traces used for pinning can be done at the end. For example, this can be accomplished while sawing a panel for separating individual PCBs, and/or by drilling holes on or in the PCBs. In particular, an implementation of a unique trace design along a saw line may ensure an easy yet thorough detachment.

Advantageously, the electric interconnection network may be realized in immediate subsequent order to the embedding process of the electronic component(s) into the PCB, mitigating ESD-hazard as early as possible. The electric interconnection network may be maintained through the whole PCB manufacturing process and even beyond that. Breaking up the interconnections may be done before the usage of the PCB for a related application.

Exemplary embodiments of the ESD protection structure can be implemented during the PCB layout is done, for example as an additional auxiliary track and via network. This network can be disconnected from a functional track section of the PCB in a final finishing stage: During the PCB singulation process, the ESD protection auxiliary network can be routed to the edges of the PCB without negatively impacting the PCB layout. Alternatively, this can be accomplished by drilling trough a connection of a shorted ESD-sensitive terminal. The latter scenario may be implemented for instance in case it is not possible or desired to extend an auxiliary network to reach the edge of the PCB. For instance, an exemplary embodiment may make it possible to open copper traces along a mid-region of PCB sidewalls.

According to an exemplary embodiment, the implementation of the ESD protection structure may be realized purely on system level. The concept of forming a temporary ESD protection structure may be applied to very different kinds of printed circuit boards for very different kinds of applications, i.e. is not product specific and can be applied to each scenario in which one or more electronic components are embedded into a PCB laminate. Exemplary embodiments may make it easier to embed one or more electronic components into a PCB while ensuring a high reliability.

Advantageously, an auxiliary ESD protection structure can be integrated easily into a PCB based on standard PCB routing methods, to enable PCB embedding of electronic components in a standard PCB manufacturing line. At the same time, this may make it possible to keep the need for additional ESD safety measures at an acceptably low level.

Further, it may be advantageous and simple to disconnect the auxiliary ESD protection structure from the functional PCB trace and via network before using the manufactured PCB for the first time.

During PCB manufacture, handling and transportation of preforms of PCBs, such as panels, between different process stations may be particularly critical in terms of ESD issues. This applies also to processes such as brush cleaning of PCB surfaces after lamination, plugging of non-filled plated through holes and/or micro vias, filling of non-filled plated through holes and/or micro vias with resin material, grinding, etc. Moreover, technologies used for pressing resin material and surface cleaning after filling are conventionality ESD critical processes. Such conventional shortcomings may be overcome according to exemplary embodiments by implementing an ESD protection structure in a PCB preform.

In embodiments, it may be additionally possible to integrate an ESD protection within the electronic component itself. Advantageously, ESD sensitive terminals can also be shorted on package level and broken up later by drilling through (descriptively speaking, a sort of electronic fuse may be implemented).

FIG. 1 illustrates a preform of a printed circuit board 100 and FIG. 2 illustrates a readily manufactured printed circuit board 100 according to an exemplary embodiment. Both FIG. 1 and FIG. 2 show a respective plan view. The printed circuit board 100 according to FIG. 2 can be obtained by removing a circumferential part of the preform according to FIG. 1.

The illustrated printed circuit board 100 comprises a laminate 104 composed of a plurality of stacked interconnected layers. Said layers comprise one or more dielectric layers (see reference sign 150 in FIG. 3 and FIG. 4), for instance made of FR4. Moreover, said layers comprise one or more patterned metal layers (see reference sign 152 in FIG. 3 and FIG. 4), for instance made of copper. Beyond this, laminate 104 may comprise metallic vertical through connections such as copper vias (see reference sign 154 in FIG. 3 and FIG. 4). Constituents of the laminate 104 may be interconnected by pressure and heat.

Preferably, the laminate 100 may have a symmetrical layup, whereas also an asymmetric layup may be possible in other embodiments.

Furthermore, an electronic component 102 is embedded in an interior of the laminate 104. For example, electronic component 102 may be a semiconductor chip. Electronic component 102 may comprise electrically conductive pads 156 on one or both opposing main surfaces thereof. For example, electronic component 102 may be configured as field effect transistor chip with source pad and gate pad on one main surface (the ones shown in FIG. 1 and FIG. 2), and drain pad on the opposing other main surface (not shown in FIG. 1 and FIG. 2). In particular the gate pad is critical concerning electrostatic discharge (ESD) damage during a manufacturing process. Hence, the gate pad is an electrostatic discharge sensitive terminal 110. In the shown embodiment, the gate pad is ESD protected by being short circuited with the source pad by a metallic electrostatic discharge protection structure 106 (for instance made of copper) which electrically couples the gate pad with the source pad in the preform of the printed circuit board 100 according to FIG. 1. For example, the electrostatic discharge protection structure 106 may be manufactured together with the metallic layers 152 and the vertical through connections 154 during creation of laminate 104. Hence, the electrostatic discharge protection structure 106 may be formed substantially without extra effort.

Advantageously, during manufacturing the printed circuit board 100 according to FIG. 2, the electronic component 102 can be reliably protected against electrostatic discharge by the electrically conductive electrostatic discharge protection structure 106 being integrated in the laminate 104 and being electrically connected to the electronic component 102. Hence, the ESD protection is achieved on hardware level and may therefore render ESD protection in the manufacturing line dispensable, or may at least relax the requirements concerning ESD protection in the manufacturing line.

As shown in FIG. 1, it may be possible to configure the electrostatic discharge protection structure 106 as a metallic electrostatic discharge protection interconnection network 108 fixing the electrostatic discharge-sensitive terminal 110 (i.e. the gate pad in the present scenario) of the electronic component 102 to an electrostatic discharge protection potential during the manufacturing process. In the shown configuration, said electrostatic discharge protection potential is the potential of the source pad. Alternatively, the electrostatic discharge protection potential may for instance be a ground potential, or another reference potential.

In order to produce the printed circuit board 100 shown in FIG. 2, the printed circuit board 100 (indicated with dashed lines in FIG. 1) may be separated from part of the electrostatic discharge protection interconnection network 108 before completing manufacture of the printed circuit board 100. In the shown embodiment, a central portion of the preform of FIG. 1 may be separated from an annular portion of the preform of FIG. 1, for instance by mechanically sawing, laser cutting or etching. As shown in FIG. 2, this enables the electrostatic discharge-sensitive terminal 110 in form of the gate pad of the electronic component 102 to be brought, independently from the source pad, to various electric potentials during use of the printed circuit board 100. Thus, the gate pad of the readily manufactured printed circuit board 100 may be brought to another electric potential than the source pad, which is not possible in the preform according to FIG. 1 which shorts gate and source pads.

Thus, the method described referring to FIG. 1 and FIG. 2 comprises embedding a field effect transistor chip, as the electronic component 102, in the laminate 104, and fixing the gate pad, as electrostatic discharge-sensitive terminal 110, to the electrostatic discharge protection potential of the source pad during the manufacturing process. At the end of the manufacturing process, the electric potentials of gate pad and source pad are separated by removing part of the electrostatic discharge protection structure 106. As a result of this procedure and as shown in FIG. 2, only electrically conductive electrostatic discharge protection structure residues 126—as part of the former electrostatic discharge protection structure 106—remain at the readily manufactured printed circuit board 100 of FIG. 2 after removing the exterior part of the electrically conductive electrostatic discharge protection structure 106 protecting the electronic component 102 against electrostatic discharge during the meanwhile completed process of manufacturing the printed circuit board 100. More specifically, the electrostatic discharge protection structure residues 126 are residues of the electrostatic discharge protection interconnection network 108 of the electrically conductive discharge protection structure 106 fixing the electrostatic discharge-sensitive terminal 110 of the electronic component 102 to the electrostatic discharge protection potential during the manufacturing process. As shown in FIG. 2, the electrically conductive electrostatic discharge protection structure residues 126 are still electrically coupled with the electronic component 102, but may be functionally inactive in the readily printed circuit board 100. As shown as well in FIG. 2, the electrically conductive electrostatic discharge protection structure residues 126 extend up to a lateral edge or sidewall 120 of the printed circuit board 100. Thus, the electrically conductive electrostatic discharge protection structure residues 126 may be exposed at the exterior lateral sidewall 120 of the laminate 104. In particular, they may be exposed at a vertical position above a lower main surface and below an upper main surface of the laminate 104.

Again referring to FIG. 2, a protection coating 197 may be provided optionally for coating the electrostatic discharge protection structure residues 126. Therefore, the corresponding wall of the printed circuit board 100 can be electrically insulated for avoiding exposure of the electrostatic discharge protection structure residues 126.

Advantageously, a reliable ESD protection is provided to the embedded component 102 on hardware level, wherein the ESD protection which is no more needed in the readily manufactured printed circuit board 100 can be easily removed by a simple material removal process, which can be advantageously combined with a singularization process of singularizing printed circuit board 100 from a panel.

FIG. 3 illustrates a preform of a printed circuit board 100 and FIG. 4 illustrates a readily manufactured printed circuit board 100 according to another exemplary embodiment. Both FIG. 3 and FIG. 4 show a respective cross-sectional view. The printed circuit board 100 according to FIG. 4 can be obtained by removing a central part of the preform according to FIG. 3 (see reference sign 160).

According to FIG. 3, the electrostatic discharge protection structure 106 is arranged as a metal layer on an upper main surface 114 of the laminate 104 opposing a lower main surface 112 thereof.

As shown as well, a functional electric connection network 118 is integrated in the laminate 104 for functionally coupling the electronic component 102 of the readily manufactured printed circuit board 100. As shown in FIG. 3, the functional electric connection network 118 is electrically coupled with the electrostatic discharge protection structure 106, which can be implemented in internal layers of the printed circuit board 100. The electrostatic discharge protection structure 106 is partially removed before completing the manufacturing process of the printed circuit board 100, for instance by forming an opening 160 in the laminate 104 for interrupting the electrostatic discharge protection structure 106. Thus, the electrostatic discharge protection structure 106 is disconnected by removing material from a central portion of the upper main surface 114 of the printed circuit board 100 apart from a lateral edge or sidewall 120 of the printed circuit board 100. By forming the opening 160 extending through the electrostatic discharge protection structure 106, the latter is degraded into electrostatic discharge protection structure residues 126 according to FIG. 4. It may be preferred to form the electrostatic discharge protection structure 106/the electrostatic discharge protection structure residues 126 early in the manufacturing process. While electrostatic discharge protection structure 106 according to FIG. 3 shorts gate pad and source pad for providing ESD protection to the ESD sensitive gate pad (see reference sign 110), the disconnected electrostatic discharge protection structure residues 126 no longer couples the electric potentials of gate pad and source pad. Consequently, the obtained printed circuit board 100 is ready to use, since gate pad and source pad can now be brought to different electric potentials.

Next, embodiments according to FIG. 5 to FIG. 16 will be described which may break a respective ESD auxiliary structure by sawing along a sawing street.

Figure 6:
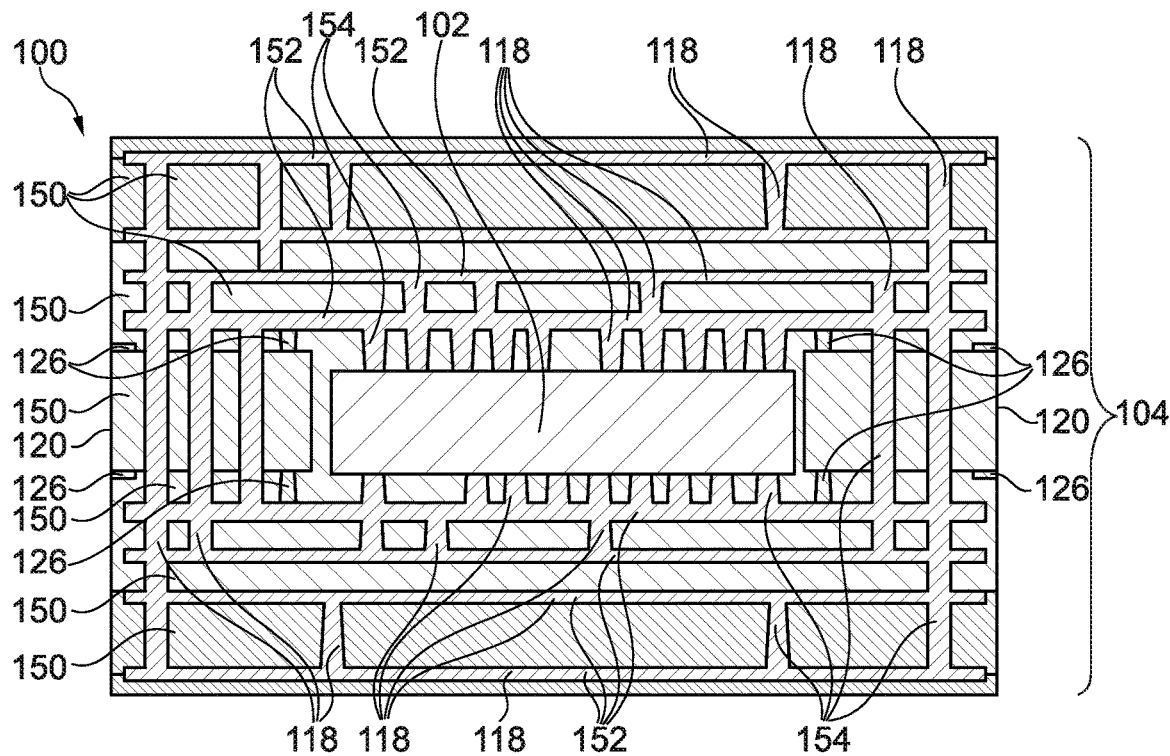
FIG. 6 illustrates a cross-sectional view of a printed circuit board according to FIG. 5 after cutting.

FIG. 5 illustrates an exploded view of a preform of a printed circuit board 100 according to an exemplary embodiment before cutting. FIG. 6 illustrates a cross-sectional view of a printed circuit board 100 according to FIG. 5 after cutting.

Referring to FIG. 5, the exploded view shows a first core 164, a first buildup layer lamination structure 166, a core layer and buildup lamination structure 168, a second buildup layer lamination structure 170, and a second core 172.

Reference sign 162 in FIG. 5 illustrates that the connection to a temporary grid may happen in a corresponding manufacturing stage.

FIG. 6 shows a cross section of printed circuit board 100 with a grid forming electrostatic discharge protection structure residue 126. Only a single electronic component 102 is embedded in the laminate 104 according to FIG. 6. An ESD auxiliary structure in form of an electrostatic discharge protection structure 106 may be removed by breaking or cutting in the sawing street during the manufacturing process of manufacturing the printed circuit board 100 of FIG. 6. The electrostatic discharge protection structure 106 is forming the basis of the illustrated electrostatic discharge protection structure residue 126. The electrostatic discharge protection structure residue 126 can be formed by, during or after singulation. This provides an ESD protection of the inlay-type electronic component 102 during the embedding process.

A sidewall protection coating (see reference sign 197 in FIG. 2), e.g. epoxy resin, can be implemented in order to electrically isolate edge exposed electrostatic discharge protection structure residues 126 and optionally exposed parts of functional electric connection network 118.

Figure 7:
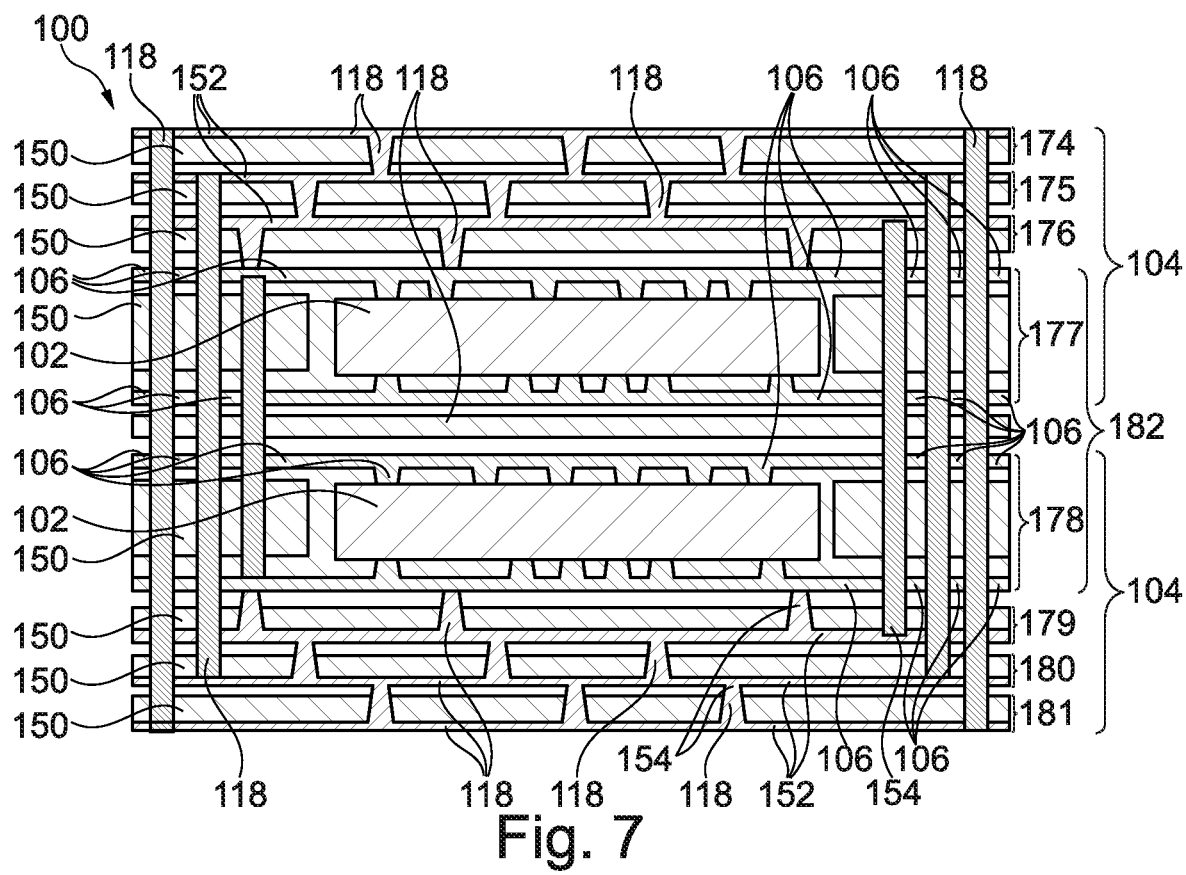
FIG. 7 illustrates an exploded view of a preform of a printed circuit board according to an exemplary embodiment.
Figure 8:
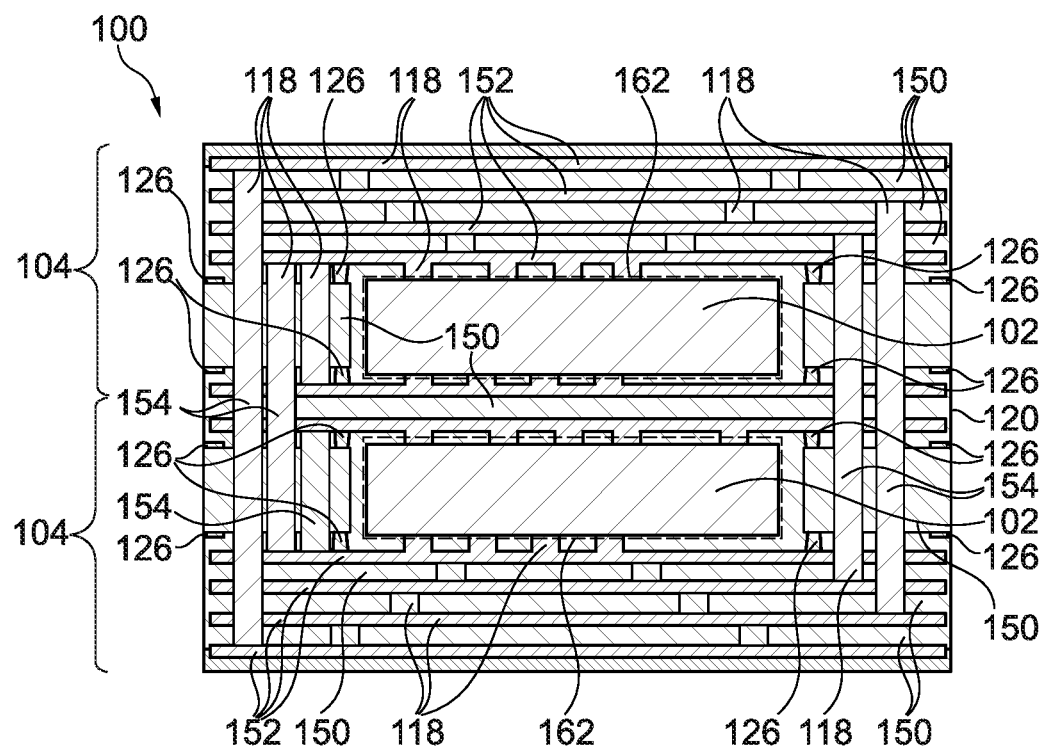
FIG. 8 illustrates a cross-sectional view of a printed circuit board according to FIG. 7 after cutting.

FIG. 7 illustrates an exploded view of a preform of a printed circuit board 100 according to another exemplary embodiment before cutting. FIG. 8 illustrates a cross-sectional view of a printed circuit board 100 according to FIG. 7 after cutting.

Referring to FIG. 7, the exploded view shows three upper buildup layer lamination structures 174, 175, 176, a top core and buildup lamination structure 177, a core layer lamination structure 182, a bottom core and buildup lamination structure 178, and three lower buildup layer lamination structures 179, 180, 181.

Referring to FIG. 8, the cross section shows the printed circuit board 100 with a temporary grid. According to FIG. 8, multiple electronic components 102 are embedded in different layers of the laminate 104, i.e. at different vertical levels.

In order to provide the printed circuit board 100 of FIG. 8, a further laminate 104 may be stacked and connected on top of the aforementioned laminate 104. A further electronic component 102 can be embedded in the further laminate 104. Moreover, further electrically conductive electrostatic discharge protection structure residues 126 may remain at the printed circuit board 100 after removing part of a further electrically conductive electrostatic discharge protection structure 106 protecting the further electronic component 102 against electrostatic discharge during the manufacturing process. To obtain the printed circuit board 100 of FIG. 8, the laminates 104 are vertically stacked and interconnected, for instance by lamination.

Figure 9:
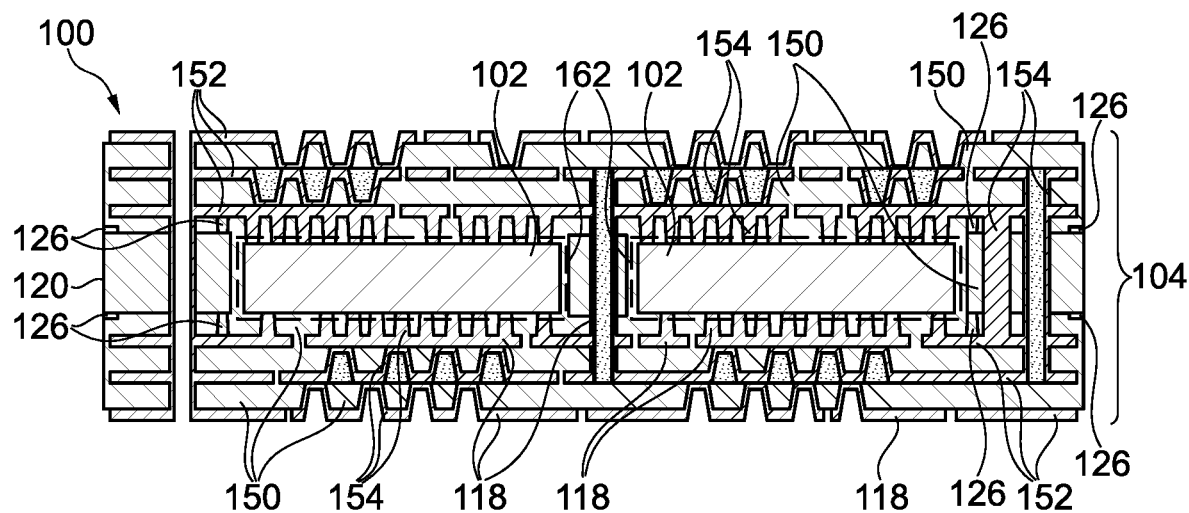
FIG. 9 illustrates a cross-sectional view of a printed circuit board according to another exemplary embodiment.

FIG. 9 illustrates a cross-sectional view of a printed circuit board 100 according to another exemplary embodiment in a vertical arrangement. Also in FIG. 9, a cross section of a printed circuit board 100 with residues of a temporary grid is shown, said residues remaining from a former electrostatic discharge protection structure 106 after completing a manufacturing process. According to FIG. 9, multiple electronic components 102 are embedded in same layer, more specifically at the same vertical level, of the laminate 104.

During the manufacturing process of the printed circuit board 100 according to FIG. 9, two electronic components 102 are embedded in the laminate 104. Directly thereafter, electrostatic discharge-sensitive terminals 110 (in particular gate pads) of both electronic components 102 may be fixed or pinned by an electrostatic discharge protection structure 106 to an electrostatic discharge protection potential, for instance the electric potential of another pad (in particular source pads) of the electronic components 102.

Figure 10:
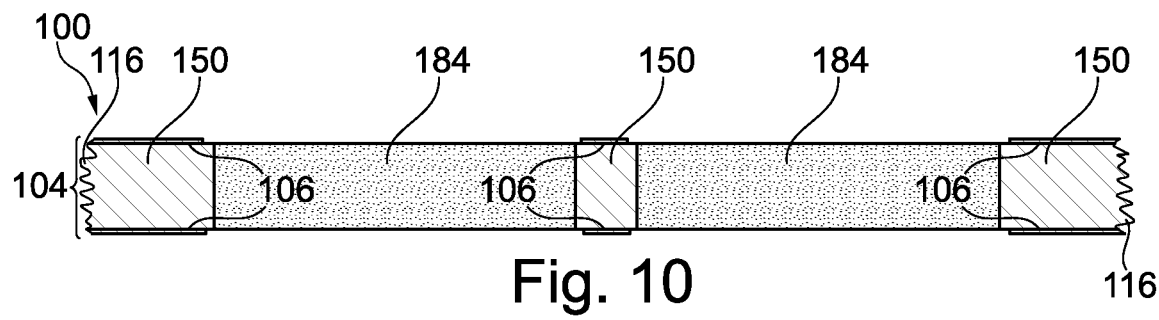
FIG. 10 illustrates a cross-sectional view of a printed circuit board forming part of a panel according to another exemplary embodiment.
Figure 11:
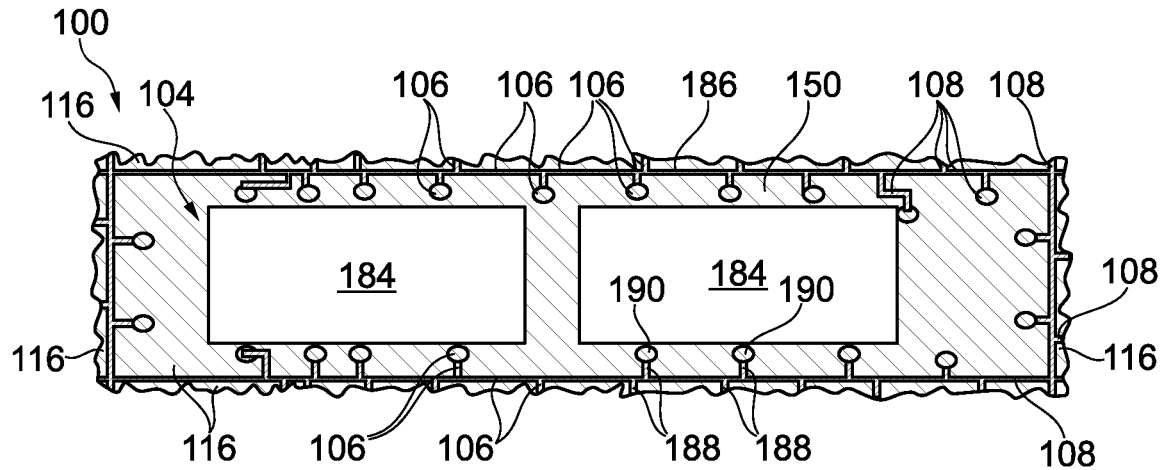
FIG. 11 illustrates a plan view of the printed circuit board according to FIG. 10 being still connected on panel level.

FIG. 10 illustrates a cross-sectional view of a printed circuit board 100 forming part of a panel 116 according to another exemplary embodiment. FIG. 11 illustrates a plan view of the printed circuit board 100 according to FIG. 12 being still connected on panel level. FIG. 10 and FIG. 11 show a cross section and a top view of an ESD protection system for printed circuit board 100. Although embedded electronic components 102 are not shown in FIG. 10 and FIG. 11, said electronic components 102 may be embedded in cavities 184 in the laminate 104. The electrostatic discharge protection structure 106 according to FIG. 11 comprises a closed circumferential loop 186 of electrically conductive material from which metallic side structures 188 are branched off. Free ends of said bifurcated side structures 188 are provided with pad-like metallic structures 190.

Figure 12:
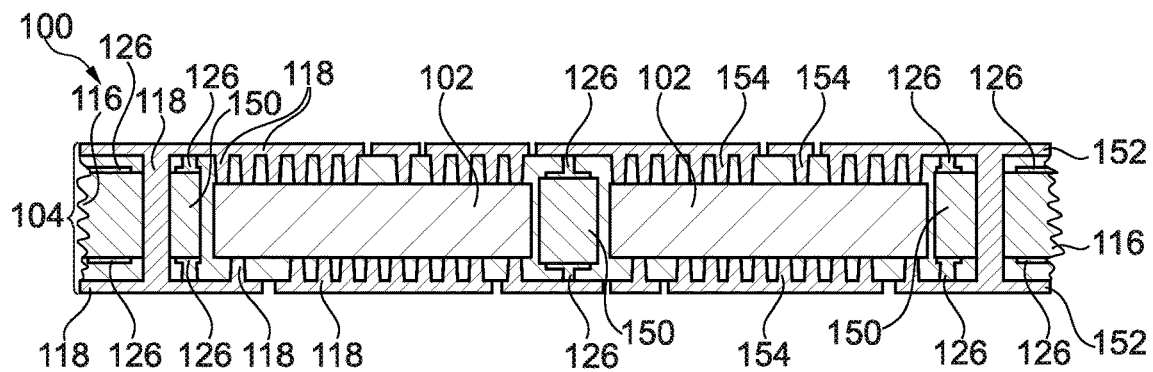
FIG. 12 illustrates a cross-sectional view of a printed circuit board forming part of a panel according to another exemplary embodiment.
Figure 13:
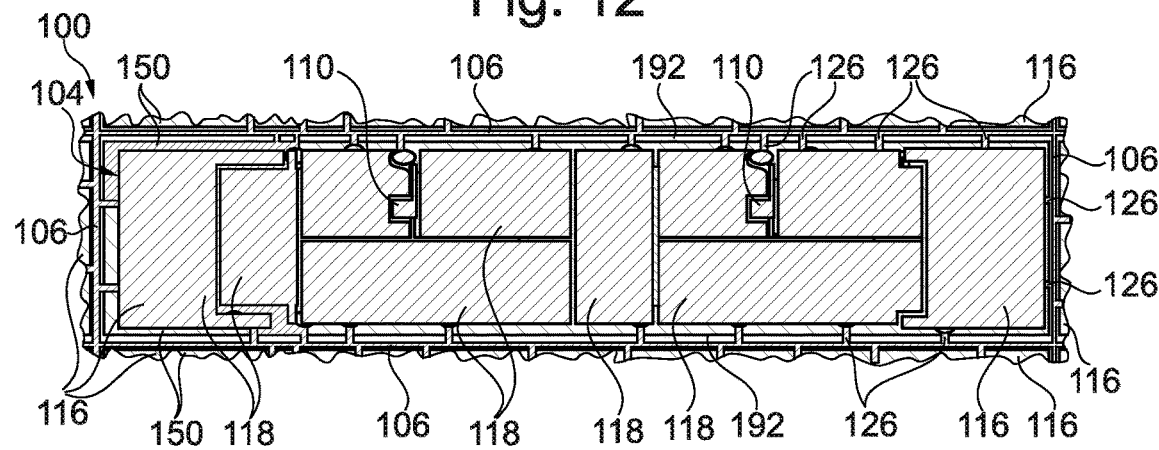
FIG. 13 illustrates a plan view of the printed circuit board according to FIG. 12 being still connected on panel level.

FIG. 12 illustrates a cross-sectional view of a printed circuit board 100 forming part of a panel 116 according to another exemplary embodiment. FIG. 13 illustrates a plan view of the printed circuit board 100 according to FIG. 12 being still connected on panel level.

The printed circuit board 100 according to FIG. 13 is still an integral part of a panel 116 comprising a plurality of printed circuit boards 100 arranged in rows and columns. In a singularization stage, the printed circuit board 100 is singularized or separated from other printed circuit boards 100 of the common panel 116.

In particular, two separate grids may be provided in a sawing line 192 region. While the first metallic grid can be used for ESD protection purposes, the second metallic grid can be used for testing purpose. At the end, the second metallic grid can be disconnected by a separation process, in particular a sawing process.

Figure 14:
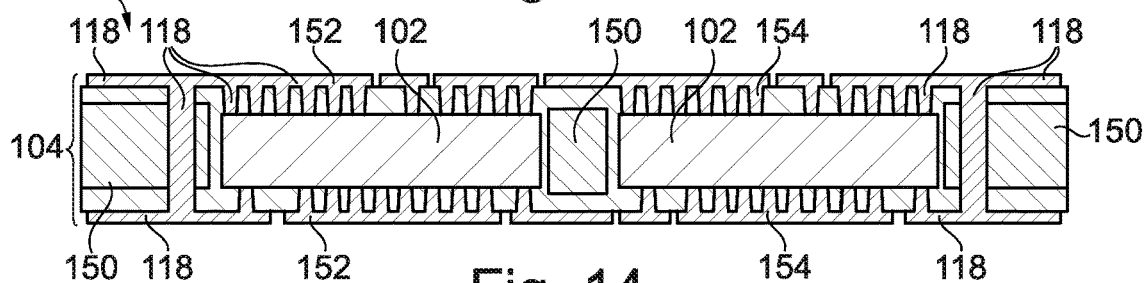
FIG. 14 illustrates a cross-sectional view of a printed circuit board according to an exemplary embodiment.
Figure 15:
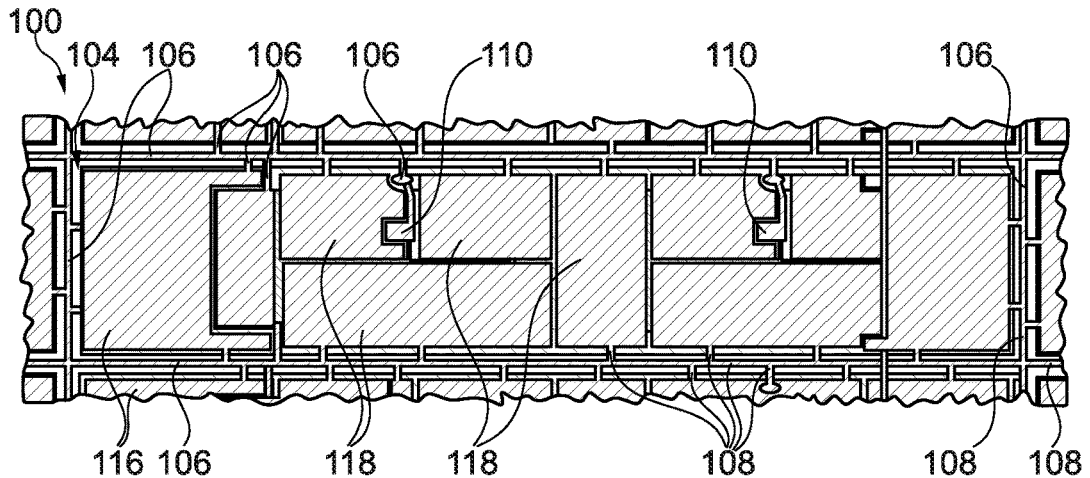
FIG. 15 illustrates a plan view of the printed circuit board according to FIG. 14 being still connected on panel-level.

FIG. 14 illustrates a cross-sectional view of a printed circuit board 100 according to yet another exemplary embodiment. FIG. 15 illustrates a plan view of the printed circuit board 100 according to FIG. 14 being still connected on panel level. FIG. 16 illustrates a plan view of the printed circuit board 100 according to FIG. 14 and FIG. 15 with further details. More specifically, FIG. 16 shows design features to ensure clean separation during PCB singulation.

Referring to reference sign 194, a side view of the printed circuit board 100 after singulation is shown. Metallic electrostatic discharge protection structure residues 126 are exposed at the dielectric sidewall 120 of the printed circuit board 100 at vertical positions above a lower main surface 112 and below an upper main surface 114 of the laminate 104.

Now referring to reference sign 196, an electrostatic discharge protection interconnection network 108 is formed with metallic substructures on both opposing main surfaces 112, 114 of the printed circuit board 100. Said substructures are connected by a further metallic substructure extending vertically through the entire laminate 104. Hence, the vertically extending substructure connects planar substructures in parallel planes. For instance, the vertical substructure may be a plated through hole bridging the entire distance between the main surfaces 112, 114.

Referring to a reference sign 198, it is shown that the electrostatic discharge protection structure residues 126 may comprise substantially Y-shaped substructures 111, substantially T-shaped substructures 113, etc.

Next, embodiments according to FIG. 17 to FIG. 24 will be described which break a respective ESD auxiliary structure by back drilling.

Figure 17:
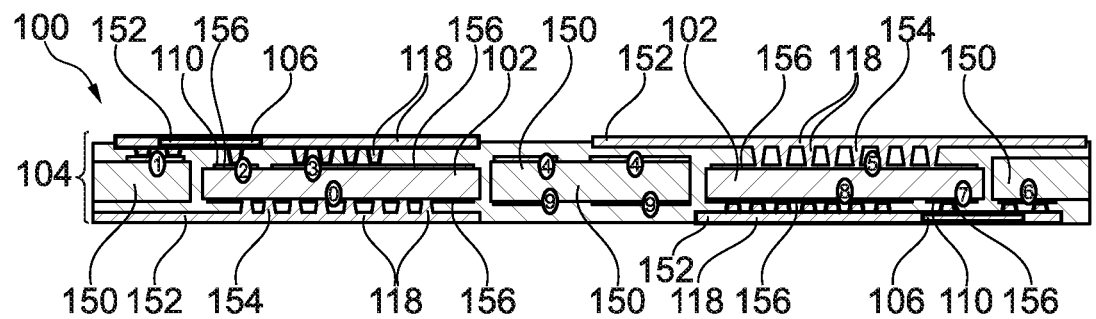
FIG. 17 illustrates a cross-sectional view of a printed circuit board according to another exemplary embodiment.
Figure 18:
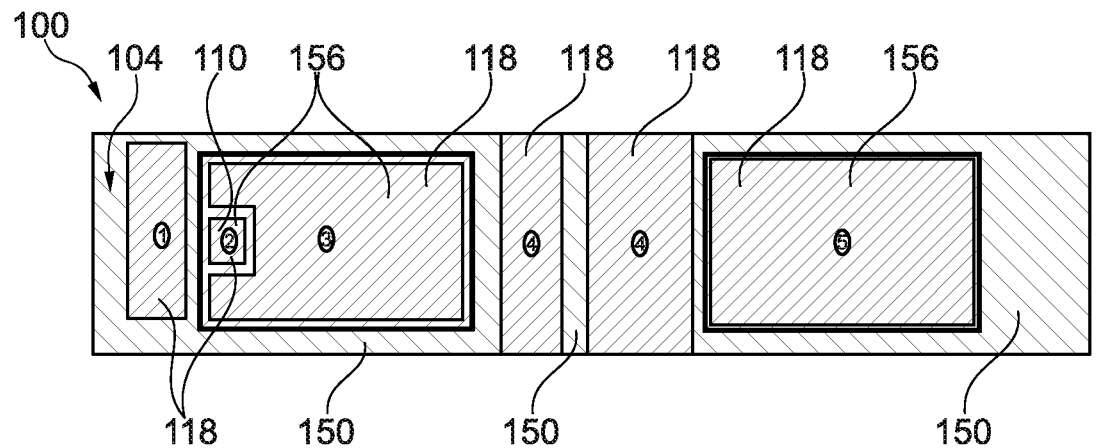
FIG. 18 and FIG. 19 illustrate plan views of the printed circuit board according to FIG. 17.
Figure 19:
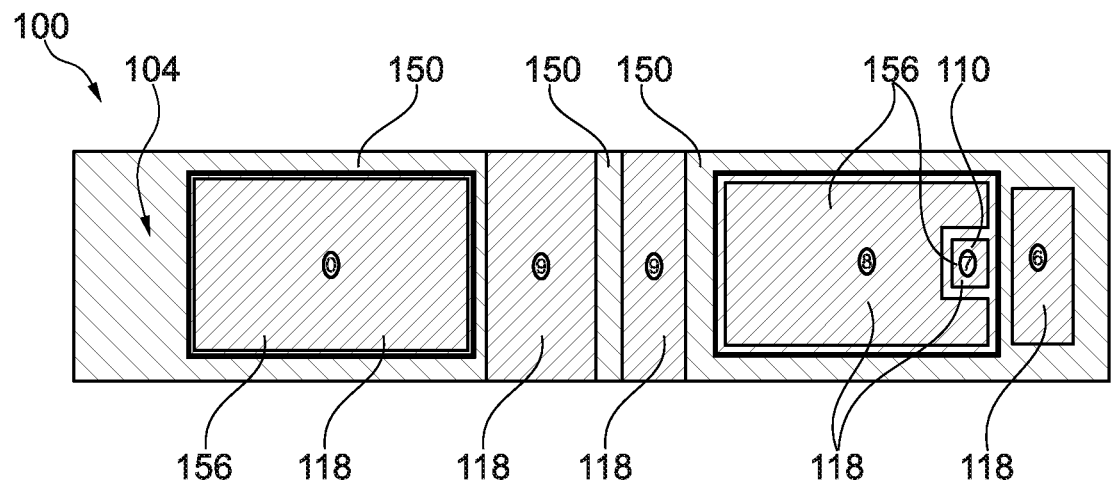

FIG. 17 illustrates a cross-sectional view of a printed circuit board 100 according to another exemplary embodiment. FIG. 18 and FIG. 19 illustrate plan views of the printed circuit board 100 according to FIG. 17. In FIG. 17 to FIG. 19, numbers 0-9 indicate like parts. While FIG. 18 shows the embedded electronic components 102 from their upper side, FIG. 19 shows the embedded electronic components 102 from their lower side. In the embodiment of FIG. 17 to FIG. 19, the auxiliary structure for ESD protection is arranged on internal layers to shortcut gate pad and source pad.

Figure 20:
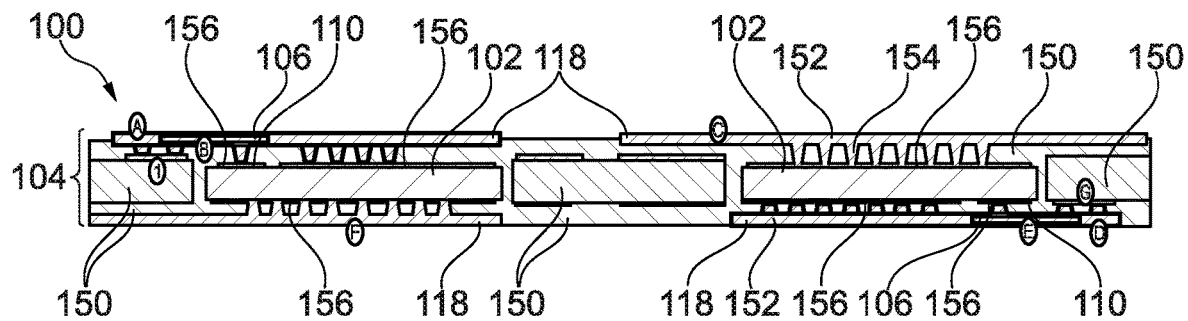
FIG. 20 illustrates a cross-sectional view of a printed circuit board according to an embodiment according to FIG. 17.
Figure 21:
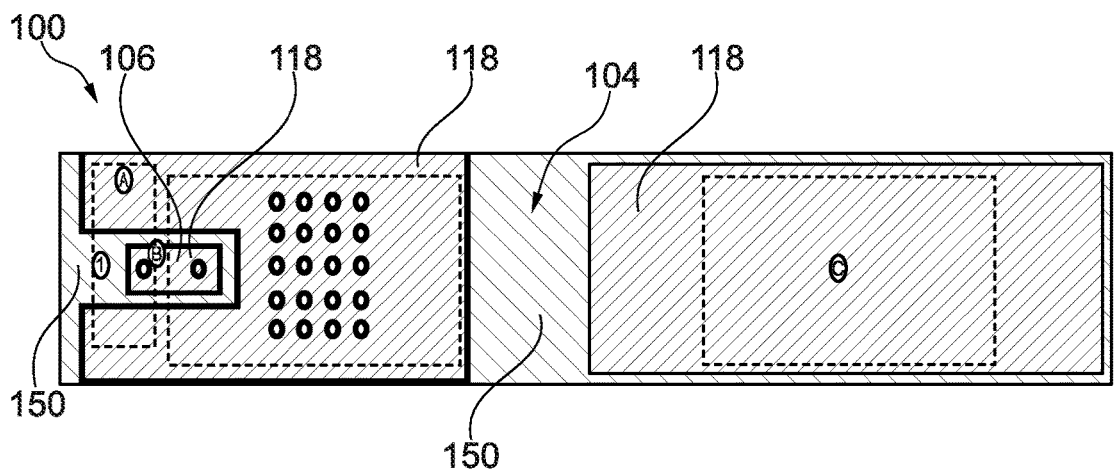
FIG. 21 and FIG. 22 illustrate plan views of the printed circuit board according to FIG. 20.
Figure 22:
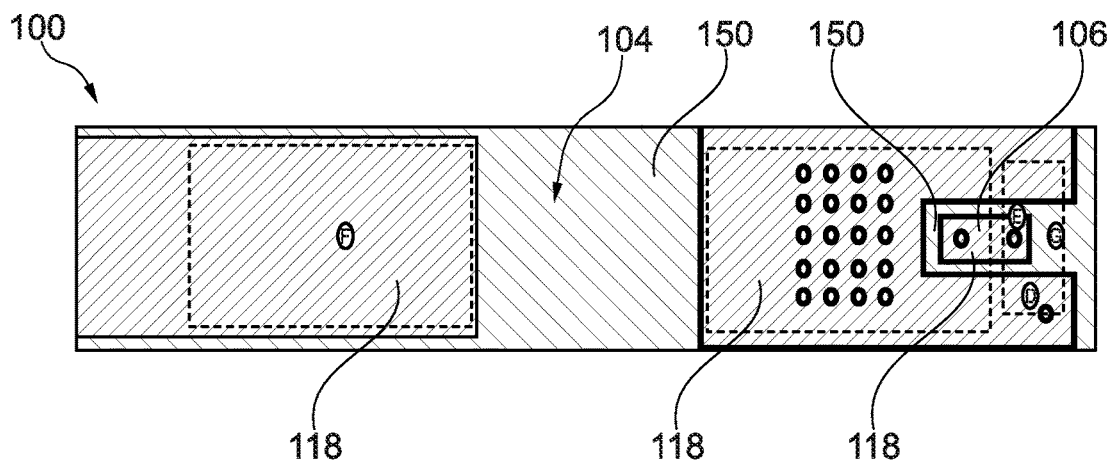

FIG. 20 illustrates a cross-sectional view of a printed circuit board 100 according to still another exemplary embodiment. FIG. 21 and FIG. 22 illustrate plan views of the printed circuit board 100 according to FIG. 22. In FIG. 20 to FIG. 22, numbers 0-9 indicate like parts. While FIG. 21 shows the embedded electronic components 102 from their upper side, FIG. 22 shows the embedded electronic components 102 from their lower side.

The embodiment of FIG. 20 to FIG. 22 is characterized by an interconnect inner layer auxiliary shortcut with device terminals with vias.

Figure 23:
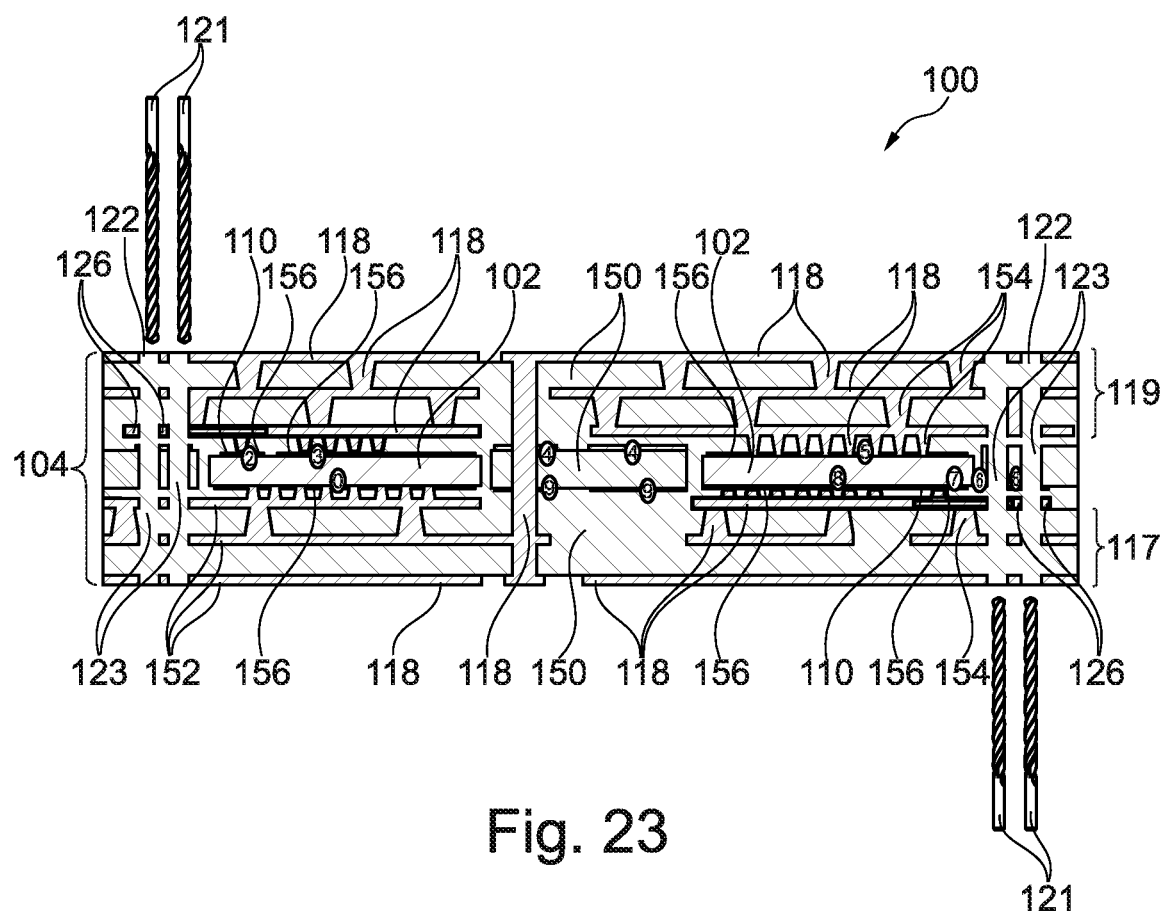
FIG. 23 illustrates a cross-sectional view of a printed circuit board according to still another exemplary embodiment.

FIG. 23 illustrates a cross-sectional view of a printed circuit board 100 according to still another exemplary embodiment. Said printed circuit board 100 may be manufactured based on the structures shown in FIG. 17 to FIG. 19 or FIG. 20 to FIG. 22, respectively. In the printed circuit board 100 according to FIG. 23, additional layer buildups 117, 119 may be added as desired or required on the top side and/or on the bottom side of the printed circuit boards 100 according to FIG. 18 to FIG. 22. Furthermore, it may be possible to open the shorts created by the auxiliary structures by back drilling. For said back drilling, mechanical drill bits 121 may be used. Created drill holes 122 may be filled with a dielectric filler 123, for instance epoxy resin.

Figure 24:
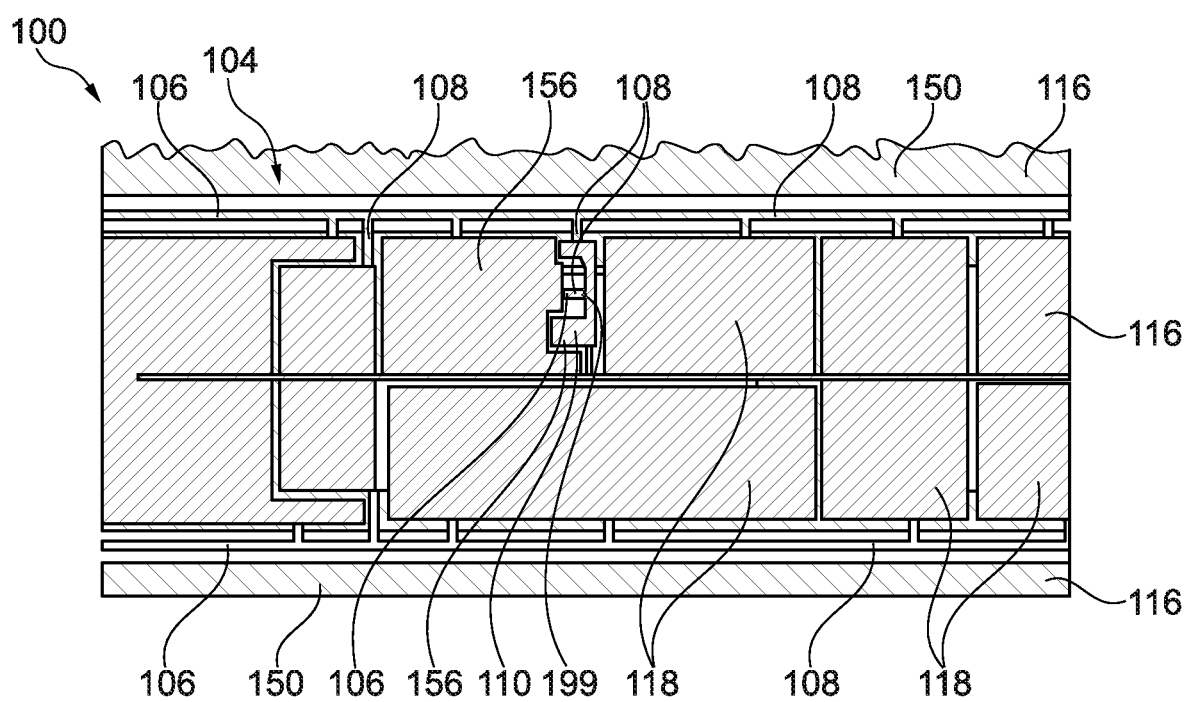
FIG. 24 illustrates a printed circuit board according to yet another exemplary embodiment.

FIG. 24 illustrates a printed circuit board 100 according to yet another exemplary embodiment. As shown with reference sign 199, a substructure of the electrically conductive electrostatic discharge protection structure 106 in a central region of a main surface of the laminate 104 may couple critical terminal 110 (such as a gate pad of a field effect transistor chip) with a target electric potential, in the shown embodiment provided at a source pad. After having completed manufacture of the printed circuit board 100, the substructure according to reference sign 199 may be at least partially removed (for instance by drilling) for electrically decoupling terminal 110 from the target electric potential for ordinary use of the printed circuit board 100.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A printed circuit board, which comprises:
    a laminate;
    an electronic component embedded in the laminate; and
    electrically conductive electrostatic discharge protection structure residues remaining at the printed circuit board after removing part of an electrically conductive electrostatic discharge protection structure protecting the electronic component against electrostatic discharge during at least part of a process of manufacturing the printed circuit board, wherein at least part of the electrically conductive electrostatic discharge protection structure residues extend to a lateral edge or sidewall of the printed circuit board and are coated at the sidewall with an electrical insulator.

2. The printed circuit board according to claim 1, wherein the electrostatic discharge protection structure residues are residues of an electrostatic discharge protection interconnection network of the electrically conductive discharge protection structure fixing one or more electrostatic discharge-sensitive terminals of the electronic component to an electrostatic discharge protection potential during at least part of the manufacturing process.

3. The printed circuit board according to claim 1, wherein at least part of the electrically conductive electrostatic discharge protection structure residues is electrically coupled with the electronic component.

4. The printed circuit board according to claim 1, wherein the electrically conductive electrostatic discharge protection structure residues at the lateral sidewall of the are at a vertical position above a lower main surface and below an upper main surface of the laminate.

5. The printed circuit board according to claim 1, wherein the electrostatic discharge protection structure residues comprise at least one of a group consisting of at least one substantially Y-shaped substructure, at least one substantially T-shaped substructure, and at least one vertically extending substructure connecting planar substructures in parallel planes.

6. The printed circuit board according to claim 1, comprising at least one of the following features:
    wherein the electronic component comprises a semiconductor chip including a power semiconductor chip and a power field effect transistor chip.

7. The printed circuit board according to claim 1, comprising:
    a further laminate;
    a further electronic component embedded in the further laminate; and
    further electrically conductive electrostatic discharge protection structure residues remaining at the printed circuit board after removing part of a further electrically conductive electrostatic discharge protection structure protecting the further electronic component against electrostatic discharge during at least part of the manufacturing process;
    wherein the laminates are vertically stacked.

8. A method of manufacturing a printed circuit board, wherein the method comprises:
    embedding an electronic component in a laminate; and
    protecting the electronic component against electrostatic discharge during at least part of the manufacturing process by an electrically conductive electrostatic discharge protection structure integrated in the laminate which electrically short-circuits one or more electrostatic discharge-sensitive terminals to another terminal of only the electronic component to fix the electrostatic discharge-sensitive terminals to an electric discharge potential of the other terminal.

9. The method according to claim 8, wherein the method comprises fixing the one or more electrostatic discharge-sensitive terminals of the electronic component by the electrically conductive electrostatic discharge protection structure to an electrostatic discharge protection potential during at least part of the manufacturing process.

10. The method according to claim 9, wherein the method comprises embedding at least one further electronic component in the laminate; and fixing one or more further electrostatic discharge-sensitive terminals of the at least one further electronic component to the electrostatic discharge protection potential, to which the one or more electrostatic discharge-sensitive terminals of the electronic component is or are fixed, during at least part of the manufacturing process.

11. The method according to claim 9, wherein the method comprises embedding a field effect transistor chip, as the electronic component, in the laminate, and fixing at least a gate pad, as electrostatic discharge-sensitive terminal, to the electrostatic discharge protection potential, in particular of a source pad, during at least part of the manufacturing process.

12. The method according to claim 8, wherein the method comprises configuring the electrostatic discharge protection structure as an electrostatic discharge protection interconnection network.

13. The method according to claim 12, wherein the method comprises forming the electrostatic discharge protection interconnection network on one or both opposing main surfaces of the laminate and/or extending through the laminate.

14. The method according to claim 12, wherein the method comprises:

integrating a functional electric connection network in the laminate for functionally coupling the electronic component;

coupling the functional electric connection network with the electrostatic discharge protection interconnection network during at least part of the process of manufacturing the printed circuit board; and disconnecting at least part of the functional electric connection network from at least part of the electrostatic discharge protection interconnection network before completing the manufacturing process of the printed circuit board.

15. The method according to claim 14, wherein the method comprises disconnecting at least part of the functional electric connection network from at least part of the electrostatic discharge protection interconnection network during separating the printed circuit board from a panel comprising a plurality of printed circuit boards.

16. The method according to claim 14, wherein the method comprises disconnecting at least part of the functional electric connection network from at least part of the electrostatic discharge protection interconnection network by removing material from a central portion of the laminate apart from a lateral edge of the printed circuit board.

17. The method according to claim 8, wherein the method comprises removing at least part of the electrostatic discharge protection structure before completing manufacture of the printed circuit board, in particular for enabling the one or more electrostatic discharge-sensitive terminals of the electronic component to be at one or more different electric potentials during use of the printed circuit board.

18. The method according to claim 17, wherein the removing is accomplished by separating the printed circuit board from other printed circuit boards of a common panel.

19. The method according to claim 8, wherein the method comprises forming the electrostatic discharge protection structure in the laminate immediately after embedding the electronic component.

\* \* \* \* \*

UNITED STATES PATENT AND TRADEMARK OFFICE
CERTIFICATE OF CORRECTION

PATENT NO. : 12,284,753 B2
APPLICATION NO. : 17/989228
DATED : April 22, 2025
INVENTOR(S) : Hassan et al.

Page 1 of 1

It is certified that error appears in the above-identified patent and that said Letters Patent is hereby corrected as shown below:

In the Claims

Column 16, Line 28, delete "of the are at a vertical position" and insert in place thereof --are at a vertical position--.

Signed and Sealed this
Twelfth Day of August, 2025

Coke Morgan Stewart
*Acting Director of the United States Patent and Trademark Office*